United States Patent [19]
Pucci et al.

[11] Patent Number: 5,459,436
[45] Date of Patent: Oct. 17, 1995

[54] TEMPERATURE COMPENSATED CRYSTAL OSCILLATOR WITH DISABLE

[75] Inventors: Gregory Pucci, Batavia; Tim Collins, Downers Grove; Larry Connell, Naperville; Dennis Marvin, Carol Stream, all of Ill.

[73] Assignee: Motorola, Inc., Schaumburg, Ill.

[21] Appl. No.: 298,915

[22] Filed: Aug. 31, 1994

[51] Int. Cl.[6] .................... H03B 5/04; H03L 1/02
[52] U.S. Cl. ............................ 331/66; 331/158
[58] Field of Search ................. 331/66, 69, 70, 331/158, 176

[56] References Cited

U.S. PATENT DOCUMENTS 4,611,181  9/1986  Fukumura et al. ............... 331/66
4,746,879  5/1988  Ma et al. ........................ 331/66 X

*Primary Examiner*—David Mis
*Attorney, Agent, or Firm*—Gary J. Cunningham

[57] ABSTRACT

A temperature compensated crystal oscillator (TCXO) (10) with a disable feature adapted to disable or enable temperature compensation. The TCXO (10) includes a crystal oscillator (12), a temperature measurement and compensation circuit (18), a timing generator (20) and a temperature compensation disable/enable circuit (30) for disabling or enabling temperature compensation updates of the crystal oscillator (12). The TCXO (10) is particularly adapted for use in connection with digital temperature compensated crystal oscillators.

11 Claims, 2 Drawing Sheets

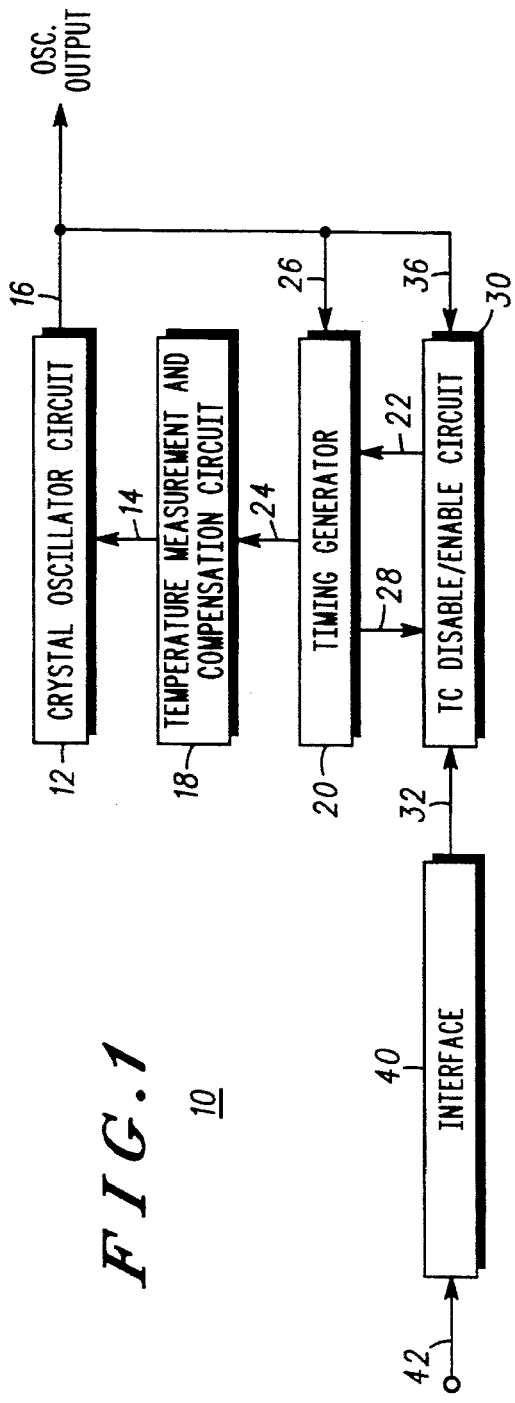
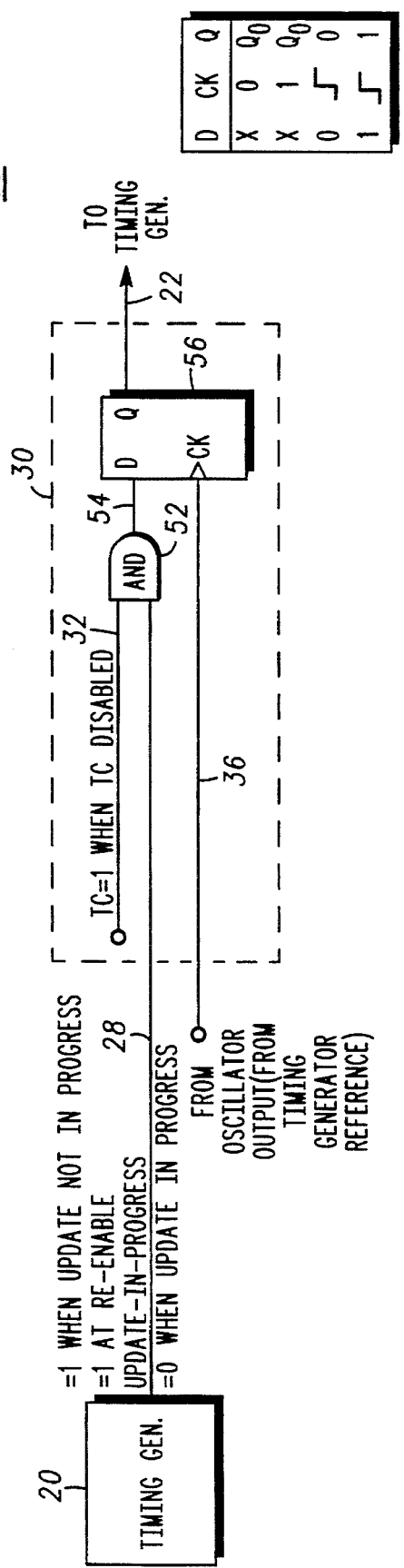

TEMPERATURE COMPENSATED CRYSTAL OSCILLATOR WITH DISABLE

FIELD OF THE INVENTION

This invention relates generally to temperature compensated circuits for crystal oscillators, and more particularly to a temperature compensation crystal oscillator with disable.

BACKGROUND OF THE INVENTION

Oscillators that have a frequency determining crystal, are commonly used to provide a stable output frequency. However, the crystals used in such oscillators are temperature sensitive and therefore temperature compensating methods are normally required to maintain a stable oscillator output frequency. One accepted method is to generate a temperature varying voltage and apply it across a varactor to control the resonant frequency of the crystal oscillator.

Analog compensation methods have discrete compensation segments each of which work over a wide temperature range. As customers demands for improved frequency versus temperature stability has increased, the degree of matching between the compensation circuit and the crystal has become critical. Hence, precise matching must be maintained over a wide temperature range. This can be difficult to accomplish in a cost effective manner, especially since analog compensation segments can have some interaction between segments.

In connection with digital compensation methods, these methods have had the advantage that each compensation point is better defined for a particular temperature, which makes for improved processing.

Digital temperature compensated crystal oscillators (TCXOs) utilize periodic temperature monitoring techniques, to determine the operating temperature of the crystal at any particular instant in time. Electronic circuitry generates frequency correction signals which compensate a particular crystal's resonant frequency versus temperature characteristics over a given temperature range. Data which is needed by this circuitry to produce the correction signals for a given crystal can be stored into non-volatile memory at the time of manufacture of the oscillator. When used in their end applications, these TCXOs monitor crystal temperature at periodic intervals, retrieve the compensation data from memory for the temperature range which includes the present temperature, and convert that data to the proper correction signal required to tune the oscillator back to the correct nominal output frequency.

Since digital TCXOs approximate the crystal's characteristic frequency-temperature curve with a finite number of temperature segments, this type of oscillator can produce an instantaneous frequency change if the crystal temperature changes sufficiently to cause the compensation circuitry to change to a different temperature segment. This sudden frequency change can cause undesirable effects to systems which require stable reference clocks, if the change occurs during a critical time interval measurement window, such as in global positioning systems. In order to improve the integrity of the reference clock during these critical time periods, sudden frequency and phase shifts caused by temperature compensation updates need to be inhibited at these times.

A device or circuit in connection with a TCXO which can inhibit or disable temperature compensation updates for a certain period of time take critical measurements, would be considered an improvement in the art.

BRIEF DESCRIPTION OF THE DRAWINGS

FIG. 1 shows a block diagram of a digital temperature compensated crystal oscillator (circuit) with a disable/enable feature, in accordance with the present invention.

FIG. 2 includes a partial schematic diagram of the digital TCXO in FIG. 1, in accordance with the present invention.

DETAILED DESCRIPTION OF THE PREFERRED EMBODIMENT

Figure 4:
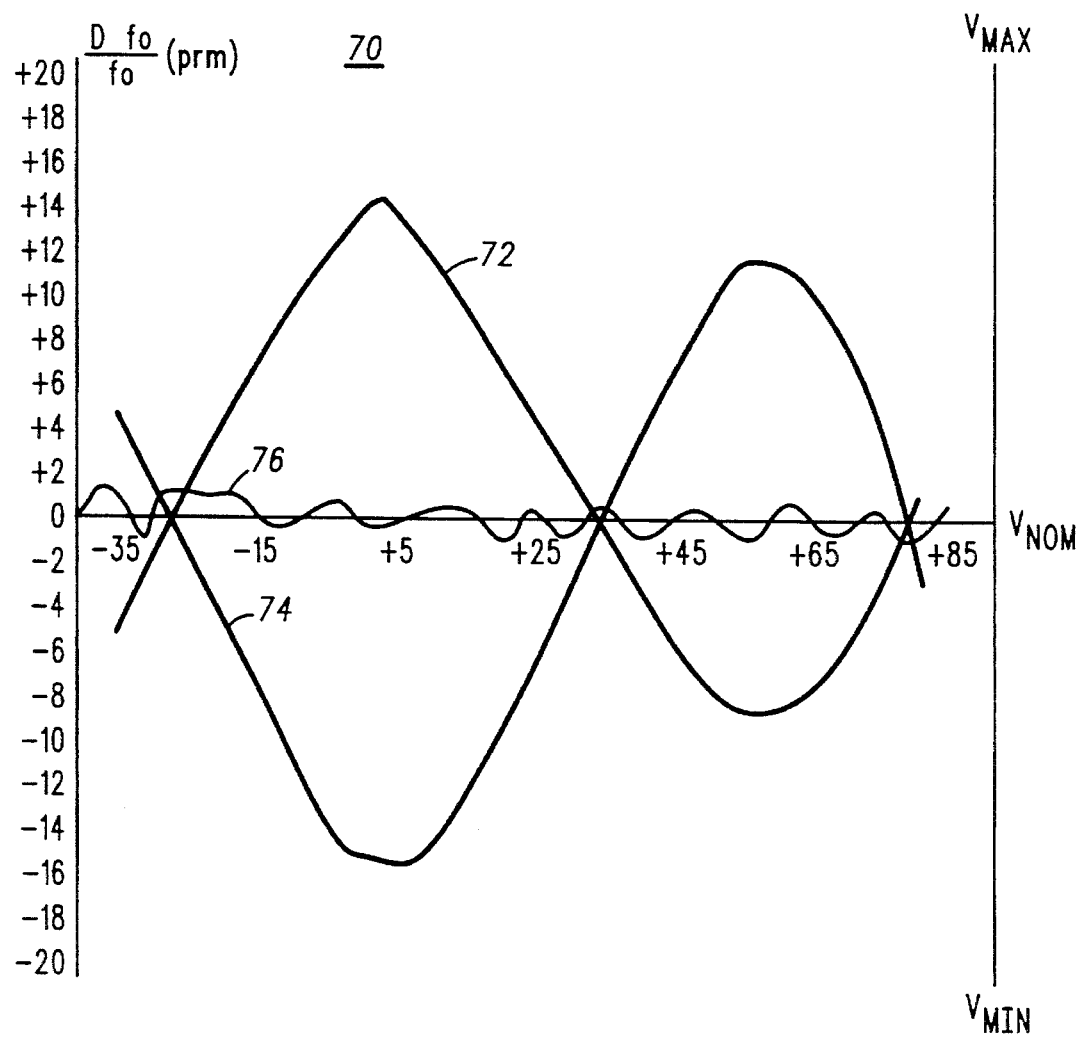
FIG. 4 is a graph showing three curves, namely, a third order uncompensated Bechmann curve, a voltage versus frequency curve for adjusting the frequency of a TCXO, and a compensated TCXO curve, in accordance with the present invention.

In FIG. 1, a block diagram of a digital TCXO 10 with a disable/enable feature is shown. The TCXO 10 is particularly adapted for use in connection with digital temperature compensated crystal oscillators having an output frequency determined by a crystal with a predetermined frequency versus temperature characteristic (Bechmann curve), as shown in FIG. 4 (as item 72). A piecewise linear approximation of the curve 74 can be used to temperature compensate a crystal to a desired frequency with a specified tolerance over a predetermined temperature range.

The TCXO 10, generally includes a crystal oscillator circuit 12 having an input 14 adapted to receive a signal for adjusting (or changing) the oscillator output frequency and an oscillator output line 16. A second block identified as item 18 includes a temperature measurement and compensation circuit for measuring the temperature in proximity to the crystal and based thereon, providing (applying) a control signal to the crystal oscillator circuit 12 to change the oscillator output frequency over a predetermined temperature range, such as that shown by item 74 in FIG. 4. A third block identified as item 20 includes a timing generator generally used for sequencing events and the like. The timing generator 20 has an input line 22, and an output line 24 connected to the temperature measurement and compensation circuit 18. A clock line 26 is shown for providing clock pulses to the timing generator 20. A second timing output line 28 is also shown going into a temperature compensation disable/enable circuit 30. The temperature compensation disable/enable circuit 30 includes an input line 32 for actuating the disable/enable circuit 32 and an output defined by line 22 connected to the timing generator 20, for enabling or disabling temperature compensation updates of the crystal oscillator. The temperature compensation disable/enable circuit 30 also includes a clock line 36 input for appropriate timing.

The timing generator 20 produces substantially all of the timing signals required for performing the periodic temperature monitoring and compensation updates, including conversion of the present temperature to a non-volatile memory address, retrieval of temperature compensation (TC) data from the corresponding memory location, and conversion of the retrieved TC data to the proper correction signal to produce the correct oscillator output frequency. The TC update disable signal (hereafter referred to as TC disable) at line 32 inhibits operation of the timing generator such that no further temperature monitoring or TC updates can occur. While TC is in the disabled state, the compensation signal corresponding to the last monitored temperature prior to activation of the TC disable is continuously applied to the compensation circuitry. The circuit 30 will freeze the TC operation until the TC disable is removed. However, major temperature fluctuations could affect the output frequency.

The TC disable signal at line 32 can occur at any time relative to the timing generator output signals, since it originates from a user request. When a TC update is in progress, if the TC disable signal is activated it is desirable that there is no delay or corruption of such TC data. In this case, an Update-in-Progress signal 28 is produced by the timing generator 20, indicating that data needed for a TC update is currently being retrieved. This signal is used to delay the TC disable signal 22 to the timing generator 20 until the TC update in progress has been completed.

When TC disable is removed, the TC disable circuit's output to the timing generator 20 is activated, and the timing generator 20 is reset in such a manner that enables an immediate temperature sampling and a TC update to occur. This insures that the oscillator's output frequency is corrected rapidly when the TC disable signal is removed. In the event that the TC disable signal has been asserted for a long enough time to allow some temperature drift to have occurred during TC disable, the oscillator may have drifted from its desired nominal output frequency. This re-enable feature, quickly resets and brings the desired output frequency back to within a specified or desired range of nominal output frequency.

In a preferred embodiment, an interface 40 is also included, which is connected to the input line 32 for actuating the disable/enable circuit 30. The interface 40 can include a serial communication bus or at least one user input signal line.

The interface 40 can provide a closed-loop control capability for enabling and disabling TC updates. The interface 40 can be connected to a serial communication bus of a microprocessor or other intelligent controlling device, for allowing the processor to disable or enable the TC updates based on other system inputs. Alternatively, the processor interface 40 can be connected to a single user input line. This would allow TC update status to be controlled by a simple hardware state machine or other non-intelligent electronic circuitry, or by a manual user input signal. In a preferred embodiment, both inputs are provided for manual and automatic triggering. Activation of either input causes TC disable to be activated.

The crystal oscillator circuit 12 includes a voltage dependent reactance element to adjust the output frequency. This voltage dependent reactance element can include various devices. In one embodiment, the voltage dependent reactance element includes a varactor.

The oscillator circuit 12 can include a circuit which responds to the compensation input signal 14 by changing the frequency of the oscillator output of line 16 in a predictable manner. Varactor diodes are used in this circuit to change the output frequency in response to a correction voltage at input signal of line 14. A plurality of varactor diodes can be substantially placed in parallel with the crystal. In use, when correction voltages are applied to these varactors, their capacitive reactances change in a known and predictable manner in response to these voltages. The changes in these reactances change the capacitive load applied to the crystal, causing the resonant frequency of the crystal circuit to change in a predictable manner. Varactor diodes are chosen as the oscillator tuning elements due to their desirable capacitance versus voltage behavior and their manufacturing convenience. Varactors can be readily manufactured in many common integrated circuit (IC) processes, including standard CMOS, Bi-polar and Bi-CMOS processes. This allows integration of the entire TCXO in 10 (except for the quartz crystal), into a single monolithic IC, providing an efficient implementation in terms of size, cost and power consumption.

In use, the temperature measurement and compensation circuit 18 monitors temperature in proximity to the crystal, and creates a correction voltage at line 14, which is applied to the varactors of the crystal oscillator circuit 12. This correction voltage tunes the frequency of the oscillator output 16 in such a manner as to maintain a substantially constant output frequency over a desired temperature range, such as a two part per million (ppm) TCXO, as shown by curve 76 in FIG. 4. The TCXO 10 of FIG. 1 can be made to be 1 ppm or less, if desired for more rigorous applications.

The timing generator 20 provides much of the necessary signaling required by the temperature measurement and compensation circuit 18, to periodically monitor temperature, retrieve TC data for the current (or present) temperature from memory, and convert this data to the correction voltage at line 14. It also supplies the update in progress signal at line 28 to the TC disable/enable circuit 30, to delay the TC disable function until the update in progress is completed. The disable/enable circuit 30 synchronizes the TC disable command input 32 with the internal timing generator signals.

The interface circuit 40 provides the interface between the user input command 42 and the TC enable/disable circuit 30. It can consist of a microprocessor interface bus, a command decoder for converting the input command into the TC disable signal 32, and a storage element to retain the last received state of the TC disable/enable signal (either enabled or disabled). It may also contain combinatorial logic to include a single user TC disable input signal.

In one embodiment, the temperature compensation enable/disable circuit 30 includes a storage element, which can vary widely. In one embodiment, the storage element can be a D flip-flop, as shown in FIG. 2. A D flip-flop is used as a convenient element to synchronize the TC disable input 32 with the timing generators internal timing signals, and to retain the state of the TC disable command. As should be understood by those skilled in the art, other possible implementations can be used and are within the scope of this invention.

The disable/enable circuit 30 can include an And gate 52 and a D flip-flop 56, with an output of the And gate being connected to an input of the D flip-flop 56, as shown in FIG. 2.

Advantageously, the And gate 52 includes a TC disable input and an update in progress signal input, at lines 32 and 28, respectively, in FIG. 2. With this arrangement, the update in progress signal line 28 inhibits activation of the TC disable function until the update in progress has been completed.

The timing generator 20 and the disable/enable circuit 30 can include clock reference signals from the same reference source or different reference sources from the oscillator output line 16.

In a preferred embodiment, the reference source provided by clock lines 26 and 36 are buffered outputs from oscillator output line 16 of the crystal oscillator circuit 12. The timing generator 20 is described in more detail in connection with

FIG. 3.

Referring to FIG. 2, a partial schematic diagram of the circuit 30 is shown. The disable/enable circuit 30 includes an And gate 52 including a TC disable input line 32 and update in progress of line 28. The output of the And gate 52 is identified as line 54, which is connected to a D flip-flop 56.

Figure 3:
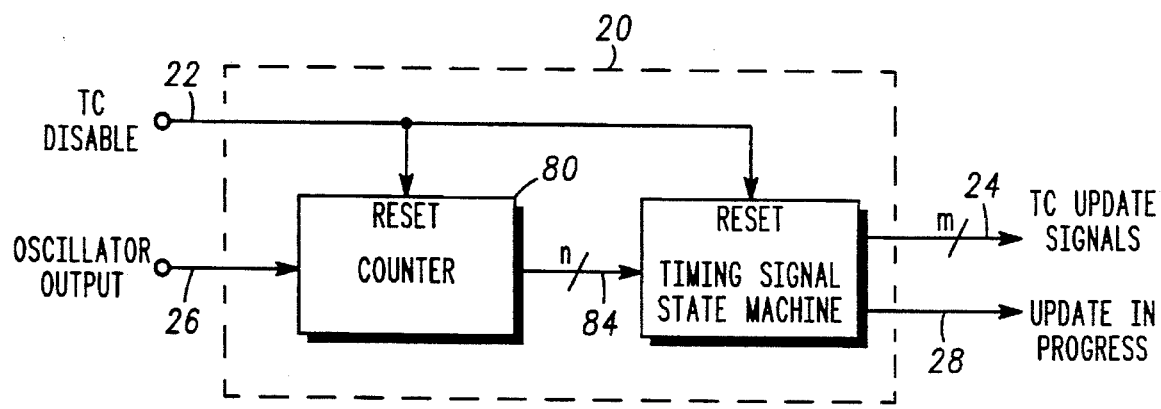
FIG. 3 includes a block diagram of a timing generator for use in the TCXO in FIG. 1, in accordance with the present invention.

A more detailed view of the timing generator 20 is shown in FIG. 3. The timing generator 20 can include a counter 80 and a timing signal state machine 82. The counter 80 can receive a buffered clock signal from the oscillator output at line 26, as shown in FIG. 1. It provides a number (N) of output signals to the timing signal state machine 82. These output signals are synchronized with the frequency of the oscillator output at line 16 and are reduced in frequency by powers of 2. That is, the N output signals at line 84 have frequencies equal to the oscillator output at line 16 divided by 2, 4, 8, 16 and so on. These N signals are used by the state machine 82 to produce a number (m) of timing signals at line 24 needed by the temperature measurement and compensation circuit 18 to perform its functions. These functions include periodic temperature monitoring, TC data retrieval from memory, and conversion of the TC data to a correction voltage at line 14, which is used by the oscillator circuit 12 to correct the oscillator output frequency at line 16. In addition to the TC update signals at line 24, the state machine 82 also provides an update-in-progress signal at line 28, which is used by the TC disable/enable circuit 30 to synchronize the TC disable/enable signal at line 32, with the timing generators internal timing signals.

The TC disable circuitry operates as follows. A TC disable signal at line 32 is received from the interface 40, upon request from the user via appropriate signals at line 42. In FIG. 2, the TC disable signal 32 is at a logic one when TC disable is requested. If this input occurs during a time interval in which a TC update is in progress, the update-in-progress signal at line 28 from the timing generator 20 is at logic zero. This causes And gate 52 to maintain a logic zero, at line 54. (When the present update is completed, the timing generator 20 changes the update in progress signal at line 28 to a logic one.) If the TC disable input 32 occurs when there is not an update in progress, the And gate 52 produces a one at signal 54 substantially immediately. The logic one's, on lines 28 and 32 cause the And gate 52 to produce a logic one signal at line 54. At the next logic zero to one transition of the oscillator output at line 36, a logic one is clocked into the flip-flop 56, producing a one at its output signal 22.

The one on signal 22 is supplied to the timing generator, as shown in FIG. 3. This signal resets counter 80 and state machine 82. The reset signal at line 22 causes all TC update signals at line 24 to be held in their inactive states, inhibiting any further TC updates. It also inhibits any further update-in-progress signals at line 28. Resetting of the counter 80 and state machine 82, cause the timing generator 20 to prepare for a TC update as soon as their reset signals at line 22 are released. Initiation of a TC update occurs when the counter reaches a count of zero, which can occur either by resetting the counter with the TC disable signal at line 22, or in normal operation when the counter counts to its overflow condition and wraps around to a count of zero. When the TC disable/enable signal at line 32 returns to a logic zero (due to a TC enable command from the user), the And gate 52 causes a signal at line 54 to become a logic zero. The next zero-to-one transition from the oscillator output at line 36, clocks this zero into the flip-flop 56, producing a zero at line 22 in FIG. 2. This releases the reset signal to counter 80 and state machine 82, returning the timing generator 20 to normal (TC enabled) operation. An immediate TC update occurs due to the counter 80 and state machine 82 having been previously reset.

In FIG. 4, a graph 70 with three curves is shown. The graph 70 includes a third order uncompensated Bechmann curve 72 plotting frequency over a specified temperature range, a voltage versus frequency curve 74 to adjust the frequency output of the uncompensated Bechmann curve, and a TC compensated curve 76 of a TCXO having an accuracy of about 2 ppm over the temperature range of interest.

In a preferred embodiment, the temperature measurement and compensation circuit 18 applies a predetermined signal on line 14 to the crystal oscillator circuit 12, to temperature compensate the crystal. More particularly, the circuit 18 produces a piecewise linear approximation of an ideal curve such as 74, to TC the crystal to a desired frequency with a specified tolerance over a predetermined specified tolerance temperature range. In a preferred embodiment, the TCXO 10 substantially includes a minimal frequency variation from the desired frequency. The TCXO 10 can be more accurate than 2 ppm, in FIG. 4.

In certain circumstances, such as when used in connection with taking measurements for global positioning system receivers and the like, it may be desirable to disable the temperature compensation circuit for a predetermined period of time, so as not to get false or inaccurate readings. The instant TCXO 10 with disable, provides a disable feature for minimizing the possibility of obtaining inaccurate readings. Additionally, the invention includes a reset feature (when re-enabled) for improved accuracy and prompt temperature compensation.

Although the present invention has been described with reference to certain preferred embodiments, numerous modifications and variations can be made by those skilled in the art without departing from the novel spirit and scope of this invention.

What is claimed is:

1. A disable/enable circuit for a temperature compensated crystal oscillator having an output frequency determined by a crystal with a predetermined frequency versus temperature characteristic, comprising:

a crystal oscillator circuit having an input adapted to receive a signal for changing the oscillator output frequency and an oscillator output;

temperature measurement and compensation circuit for measuring the temperature in proximity to the crystal and based thereon, providing a control signal to the crystal oscillator circuit to adjust the output frequency over a predetermined temperature range;

a timing generator including an input and an output connected to the temperature measurement and compensation circuit; and a temperature compensation disable/enable circuit including a disable/enable input to actuate the temperature compensation disable/enable circuit and a disable/enable output connected to the timing generator for disabling or enabling temperature compensation updates for the crystal oscillator, the disable/enable input includes an enabled state and a disabled state, wherein when the disable/enable input is placed in the enabled state a substantially immediate temperature compensation update occurs to adjust the oscillator output frequency and when the disable/enable input is in the disabled state no temperature compensation occurs until placed back into the enabled state.

2. The disable/enable circuit of claim 1, further comprising an interface connected to the input of the temperature compensation disable/enable circuit.

3. The disable/enable circuit of claim 2, wherein the interface includes a serial communication bus or at least one user input signal line.

4. The disable/enable circuit of claim 1, wherein the crystal oscillator circuit includes a voltage dependent reactance element to adjust the output frequency.

5. The disable/enable circuit of claim 4, wherein the voltage dependent reactance element includes a varactor.

6. The disable/enable circuit of claim 1, wherein the temperature compensation disable/enable circuit includes a storage element.

7. The disable/enable circuit of claim 6, wherein the storage element is a D flip-flop.

8. The disable/enable circuit of claim 1, wherein the temperature compensation disable/enable circuit includes an And gate and a D flip-flop, an output of the And gate is connected to an input of the D flip-flop.

9. The disable/enable circuit of claim 8, wherein the And gate includes a temperature compensation disable input and an update in progress signal input.

10. The disable/enable circuit of claim 1, wherein the temperature compensation disable/enable circuit includes a synchronizing circuit and an update-in-progress input.

11. The disable/enable circuit of claim 10, wherein the update-in-progress input delays disabling temperature compensation updates until the update in progress cycle has been completed.

* * * * *